United States Patent
Miller et al.

(10) Patent No.: US 9,514,969 B2
(45) Date of Patent: Dec. 6, 2016

(54) APPARATUS FOR REDUCING THE EFFECT OF CONTAMINATION ON A RAPID THERMAL PROCESS

(71) Applicant: Applied Materials, Inc., Santa Clara, CA (US)

(72) Inventors: Aaron Miller, Sunnyvale, CA (US); Mehran Behdjat, San Jose, CA (US); Norman L. Tam, Cupertino, CA (US); Michael Liu, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/550,781

(22) Filed: Nov. 21, 2014

(65) Prior Publication Data

US 2015/0155190 A1 Jun. 4, 2015

Related U.S. Application Data

(60) Provisional application No. 61/909,310, filed on Nov. 26, 2013.

(51) Int. Cl.
*H01L 21/67* (2006.01)
*H01L 21/66* (2006.01)
*H01L 21/324* (2006.01)
*H01L 21/687* (2006.01)

(52) U.S. Cl.
CPC ... *H01L 21/67115* (2013.01); *H01L 21/67248* (2013.01); *H01L 21/68792* (2013.01)

(58) Field of Classification Search
CPC ............... H01L 21/10; H01L 21/67248; H01L 21/67115; H01L 21/324; H01L 22/10

USPC .......................................... 438/799; 219/400
See application file for complete search history.

(56) References Cited

U.S. PATENT DOCUMENTS

| | | | | |
|---|---|---|---|---|
| 6,021,152 A * | 2/2000 | Olsen | ...................... | C23C 14/12 118/620 |
| 6,121,061 A * | 9/2000 | Van Bilsen | ............. | C30B 25/10 118/725 |
| 6,492,648 B2 * | 12/2002 | Suzuki | .............. | H01L 21/67115 250/492.2 |
| 6,720,531 B1 * | 4/2004 | Jacobson | .............. | C23C 16/481 118/50.1 |
| 2004/0185680 A1 * | 9/2004 | Hauf | ...................... | C23C 16/481 438/795 |
| 2005/0003600 A1 * | 1/2005 | Kasai | ...................... | C23C 16/14 438/200 |

(Continued)

*Primary Examiner* — Caridad Everhart
(74) *Attorney, Agent, or Firm* — Patterson & Sheridan, LLP (57) ABSTRACT

Embodiments of the present disclosure provide a cover assembly that includes a cover disposed between a device side surface of a substrate and a reflector plate, which are disposed within a thermal processing chamber. The presence of the cover between the device side surface of a substrate and a reflector plate has many advantages over conventional thermal processing chamber designs, which include an improved temperature uniformity during processing, a reduced chamber down time and an improved cost-of-ownership of the processes performed in the thermal processing chamber. In some configurations, the cover includes two or more ports that are formed therein and are positioned to deliver a gas, from a space formed between the reflector plate and the cover, to desired regions of the substrate during processing to reduce the temperature variation across the substrate.

11 Claims, 5 Drawing Sheets

(56) References Cited

U.S. PATENT DOCUMENTS

2005/0260835 A1\* 11/2005 Sha .................. C23C 16/45565
                                                                  438/509

\* cited by examiner

FIG. 6

APPARATUS FOR REDUCING THE EFFECT OF CONTAMINATION ON A RAPID THERMAL PROCESS

CROSS-REFERENCE TO RELATED APPLICATIONS

This application claims benefit of U.S. provisional patent application Ser. No. 61/909,310, filed Nov. 26, 2013, which is hereby incorporated herein by reference.

BACKGROUND

Field

Embodiments of the present disclosure generally relate to methods and apparatus for thermally processing a substrate.

Description of the Related Art

Substrate processing systems are used to fabricate semiconductor logic and memory devices, flat panel displays, CD ROMs, and other devices. During processing, such substrates may be subjected to chemical vapor deposition (CVD) and rapid thermal processes (RTP); RTP processes include, for example, rapid thermal annealing (RTA), rapid thermal cleaning (RTC), rapid thermal CVD (RTCVD), rapid thermal oxidation (RTO), and rapid thermal nitridation (RTN). RTP systems usually include a heating lamps which radiatively heat the substrate through a light-transmissive window. RTP systems may also include other optical elements, such as an optically reflective surface opposing of the substrate surface and optical detectors for measuring the temperature of the substrate during processing.

Layers of doped glass, such as borophosphosilicate glass (BPSG) or phosphosilicate glass (PSG), are used extensively in pre-metal dielectric (PMD) layers in logic and memory devices. Doped glass layers are typically deposited onto a substrate in a CVD system and are subsequently heated to a high temperature in an RTP chamber or a furnace. In one heating process, doped glass is densified by heating the doped glass to a temperature of 700-800° C. in an RTP chamber. Heating the doped glass reduces the porosity of the layer, relieves stress in the film, drives off residual impurities left from CVD deposition, stabilizes the dopants against atmospheric instability, and activates the gettering capability of the phosphorous oxides ($PO_x$) in the film for trapping alkali ions. BPSG can be heated to higher temperatures, such as 850-950° C., to decrease the viscosity of the BPSG and cause macroscopically visible flow (reflow) that planarizes the BPSG surface and enables the BPSG to fill surface features of underlying layers.

Further, ion implantation is a preferred method for introduction of chemical impurities into semiconductor substrates to form the pn junctions necessary for field effect or bipolar transistor fabrication. Such impurities include p-type dopants such as boron (B), aluminum (Al), gallium (Ga), beryllium (Be), magnesium (Mg), and zinc (Zn) and N-type dopants such as phosphorus (P), arsenic (As), antimony (Sb), bismuth (Bi), selenium (Se), and tellurium (Te). Ion implantation of chemical impurities disrupts the crystallinity of the semiconductor substrate over the range of the implant. At low implant energies, relatively little damage occurs to the substrate. However, the implanted dopants will not come to rest on electrically active sites in the substrate. Therefore, an "anneal" is required to restore the crystallinity of the substrate and drive the implanted dopants onto electrically active crystal sites. As used herein, "annealing" refers to the thermal process of raising the temperature of an electrically inactive region of a substrate from an ambient temperature to a maximum temperature for a specified time and cooling to ambient temperatures for the purpose of creating electrically active regions in a device. The result of such annealing and/or the annealing process is sometimes also referred to as "implant annealing," "activation annealing," or "activation." Thermal processes such as rapid thermal processing (RTP) and spike annealing are the main dopant activation methods.

Figure 1:
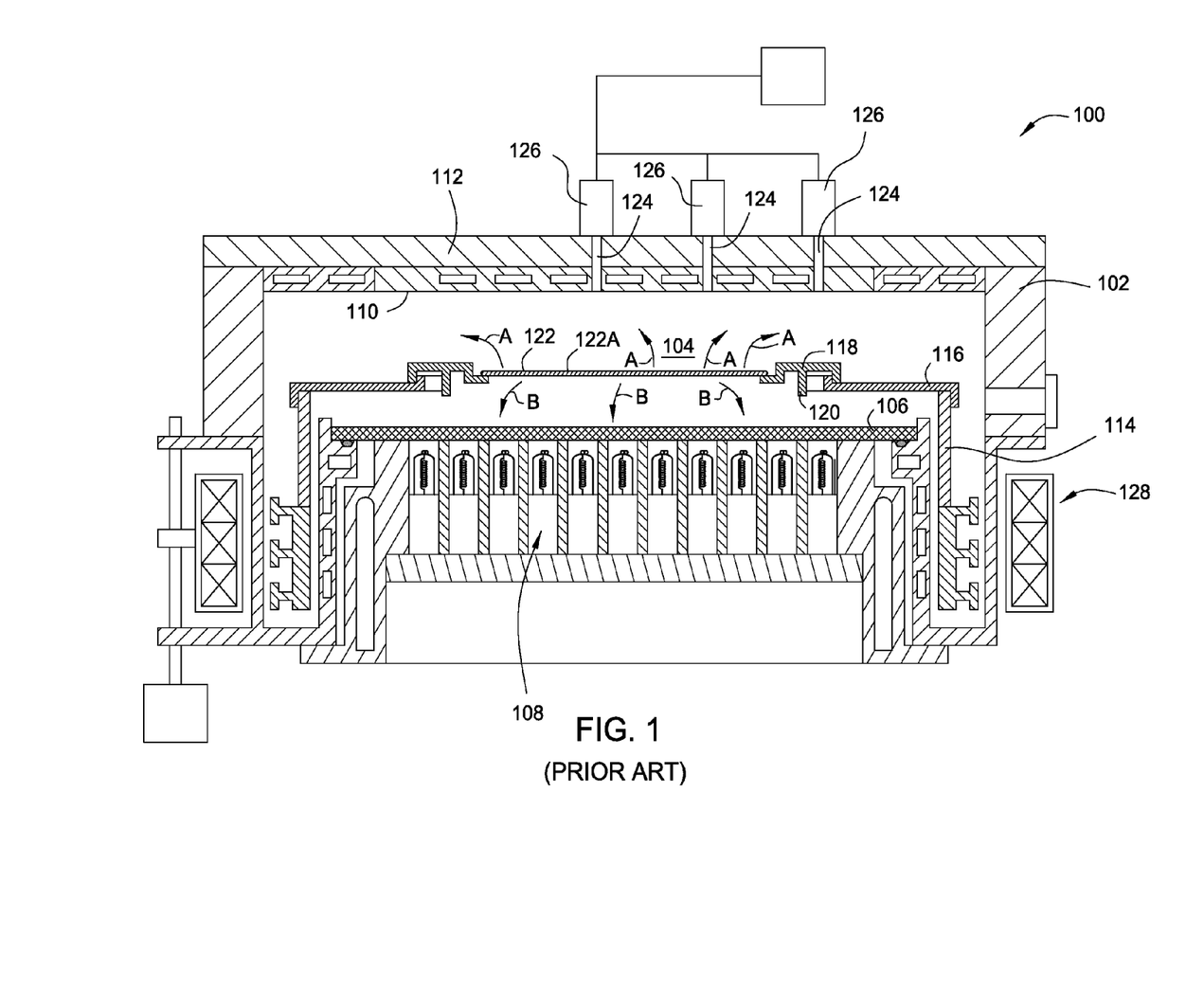
FIG. 1 is a schematic side cross-sectional view of a thermal processing chamber.

FIG. 1 is a schematic sectional view of a processing chamber 100 of a conventional process chamber design. The processing chamber 100 includes a chamber body 102 defining a processing volume 104. A window 106 is formed on a bottom side of the chamber body 102. A radiant energy source 108 is disposed below the window 106. The radiant energy source 108 is configured to direct radiant energy from the lamps towards the processing volume 104. A reflection plate 110 is disposed on an upper wall 112 of the chamber body 102 inside the processing volume 104. A plurality of sensors 126 may be positioned over the upper wall 112 to detect temperatures in the processing volume 104 through sensor ports 124 formed in the reflection plate 110 and the upper wall 112.

The processing chamber 100 includes a lift assembly 128 configured to vertically move and rotate a rotor 114 disposed in the processing volume 104. A supporting ring 116 is disposed on the rotor 114. An edge ring 118 is supported by the supporting ring 116. A substrate 122 is supported by the edge ring 118 during processing. The edge ring 118 and the substrate 122 are positioned above the radiant energy source 108 so that the radiant energy source 108 can heat both the substrate 122 and the edge ring 118.

During processing, the radiant energy source 108 is configured to rapidly heat the substrate 122 positioned on the edge ring 118, while the edge ring 118 heats an edge region of the substrate 122 by conduction through direct contact. The process of heating the substrate 122 causes one or more layers on or within the substrate to outgas (see arrows "A" and "B"). The material that outgases from the substrate will typically deposit on the colder walls, such as the reflector plate 110 disposed in the chamber. Moreover, semiconductor devices are typically formed on a device surface 122A of the substrate (e.g., top surface in FIG. 1), or device side of the substrate. Therefore, typically, during processing the amount of material that is outgassed from the surface of the substrate is typically greater from the device surface side (see arrows A) versus the non-device surface side (see arrows B) of the substrate. As the amount of outgassed material deposits on the surface of the reflector plate 110 the optical characteristics (e.g., reflectivity) of the surface change with time, which causes an undesirable drift in the processing temperatures of the substrates 122 processed in the process volume 104 of the conventional process chamber 100 over time. Moreover, the outgassed material will also deposit on the components (e.g., sensors 126) used to measure and control the temperature of the substrate during processing. The deposited material will thus affect the temperature measurements and the conventional system's ability to control the thermal processes performed in the processing volume 104.

The outgassed impurities may include dopant materials, a material derived from the dopant material, a material disposed in a layer formed on the surface 122A of the substrate 122. For example, boron oxides ($BO_x$) and phosphorous oxides ($PO_x$) have high vapor pressures and are produced from the surface 122A when BPSG and PSG layers disposed thereon are heated to high temperatures.

This deposition created by the outgassing process interferes with the temperature pyrometer readings and with the radiation distribution fields on the substrate, which in turn affects the processing temperature at which the substrate is annealed. Deposition of the outgassed impurities may also cause unwanted particles to deposit on the substrate and may also generate slip lines on the substrate. Depending on the chemical composition of the deposits, the chamber must be taken offline for a "wet clean" process after about 200 to 300 substrates are processed. The wet clean process requires manual intervention to clean the deposited material from the chamber walls and from the reflector plate, which may be labor intensive requiring the chamber to be offline for about four hours.

Therefore, there exists a need for a method and apparatus that minimizes the amount of deposits on reflector and chamber walls to increase the mean substrates (wafers) between cleans (MWBC) and can also improve the thermal processing environment to improve the RTP process results. There is also a need for an improved thermal processing chamber design that reduces the effect that deposits generated by an outgassed material will have on the RTP process.

SUMMARY

Embodiments of the present disclosure provide a cover assembly that includes a cover that is disposed between a device side surface of a substrate and a reflector plate, which are disposed within a thermal processing chamber. The presence of the cover between the device side surface of a substrate and a reflector plate has many advantages over conventional thermal processing chamber designs, which include improved temperature uniformity during processing, reduced chamber down time and improved cost-of-ownership of the processes performed in the thermal processing chamber.

Embodiments of the present disclosure generally provide a thermal processing chamber, comprising an energy source positioned to deliver energy to a substrate that is positioned on a substrate support during processing, a reflector having a reflective surface, wherein the substrate support is disposed between the energy source and the reflector, and a cover disposed between the reflector and the substrate support. The cover is at least partially optically transparent, and defines a cover volume region between the cover and the reflective surface. A gas source is configured to provide a gas to the cover volume region and to a substrate disposed on the substrate support during processing.

Embodiments of the present disclosure may further provide a method for processing a substrate, comprising delivering electromagnetic energy from an energy source towards a non-device side surface of a substrate that is disposed on a substrate support during processing and delivering a thermal processing gas to a cover volume region formed between a reflector plate and a cover, wherein the cover is disposed between the reflector plate and the energy source. At least a portion of the thermal processing gas delivered to the cover volume region is adapted to flow from the cover volume region through one or more ports formed in the cover to a portion of the device side surface of the substrate that has a higher temperature than the average temperature of the substrate during processing.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation

DETAILED DESCRIPTION

Embodiments of the present disclosure provide apparatus and methods for fabricating devices on a substrate. More particularly, embodiments of the present invention provide an apparatus that is configured to provide improved thermal processing uniformity, reduce the cost of consumable parts created during processing and have a reduced chamber downtime due to the need to complete cleaning operation after a number of substrates have been processed in the processing chamber.

Embodiments of the present disclosure provide a cover assembly that includes a cover that is disposed between a device side surface of a substrate and a reflector plate, which are all disposed within a thermal processing chamber. In some configurations, the cover includes two or more ports that are formed therein and are positioned to deliver a gas, from a space formed between the reflector plate and the cover, to desired regions of the substrate during processing to reduce the temperature variation across the substrate. Typically, the temperature variations across the substrate are created by the radiant heat source's non-uniform energy delivery and/or variations in the thermal environment in the thermal processing chamber. The presence of the cover within the thermal processing chamber will also reduce and/or prevent the material that outgases from the surface of the substrate during thermal processing from depositing on the reflector and thermal measurement devices, thus improving the stability of the thermal processes performed in the chamber over time. The cover assembly is thus adapted to improve thermal uniformity during processing, reduce chamber down time and improve the cost-of-ownership of the processes performed in the chamber.

Figure 2:
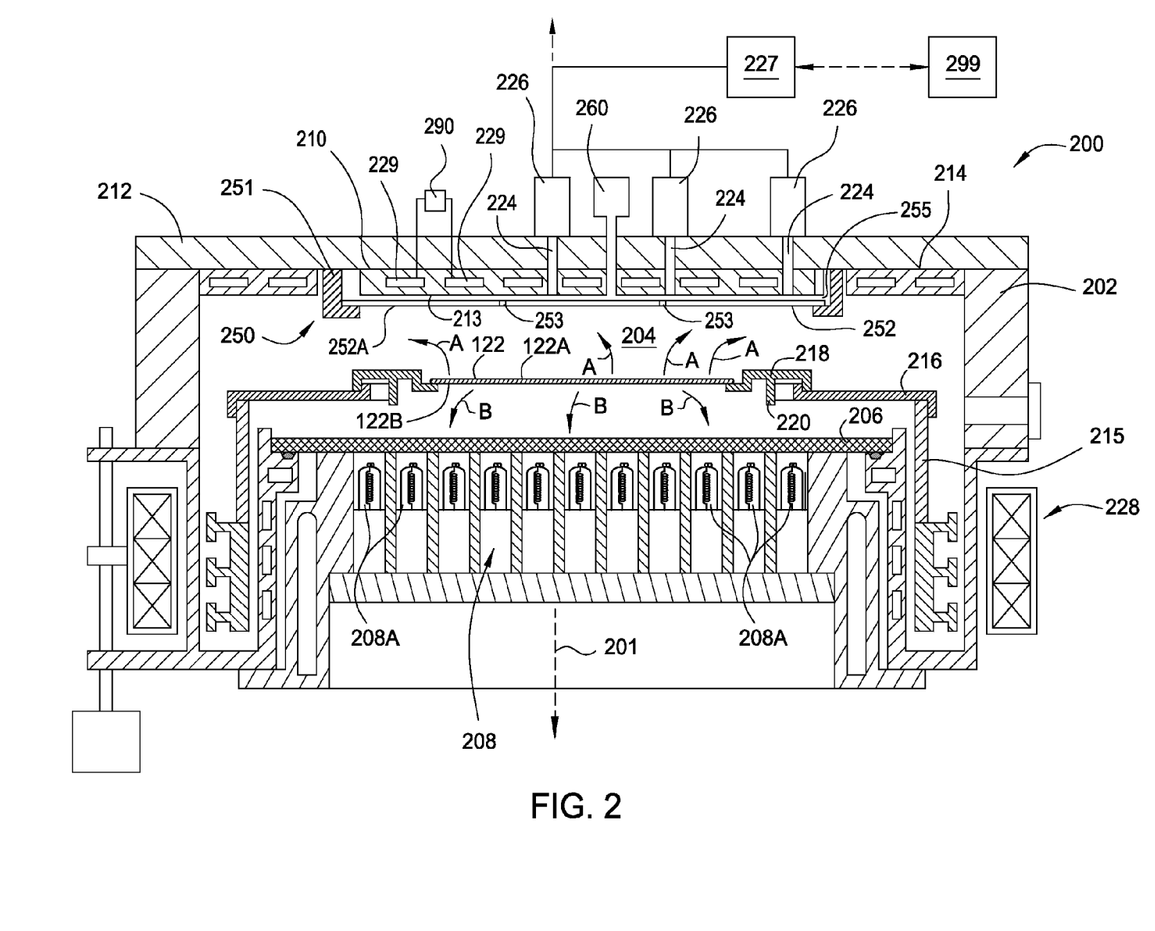
FIG. 2 illustrates a schematic side cross-sectional view of a thermal processing chamber according to an embodiment disclosed herein.

FIG. 2 is a sectional view of a processing chamber 200 according to one embodiment of the present disclosure. The processing chamber 200 includes a chamber body 202 defining a processing volume 204 and a system controller 299, which is adapted to control the various processes performed within the processing chamber 200. Generally, the system controller 299 includes one or more processors, memory, and instructions suitable for controlling the operation of the components within the thermal processor chamber 200.

A radiant source window 206 is formed on a bottom side of the chamber body 202. The radiant source window 206 may be formed from quartz or other similar material that is optically transparent to the electromagnetic energy delivered from lamps 208A disposed within a radiant energy source 208. In an effort to reduce the radiant source window's temperature during processing, reduce any induced thermal stress in the radiant source window and provide an efficient transfer of energy between the lamps 208A and substrate 122, the material from which the radiant source window 206 is formed is selected so that it will not absorb a significant amount of the generated electromagnetic energy from the lamps 208A. The radiant energy source 208, which is disposed below the window 206, is configured to direct radiant energy towards a non-device side surface 122B of a substrate 122 that is disposed within the processing volume 204. A reflection plate 210 is disposed on an upper wall 212 of the chamber body 202 inside the processing volume 204. In one configuration, a water cooled metal plate 214 is positioned around the edge of the reflector plate 210 to further provide cooling to the upper wall 212 during processing. A plurality of sensors 226, such as pyrometers, may be positioned over the upper wall 212 to detect temperatures of the substrate 122 and other related components in the processing volume 204 through sensor ports 224 formed in the reflection plate 210 and the upper wall 212. The plurality of sensors 226 may communicate with a temperature controller 227 that is adapted to receive signals from the sensors 226 and to communicate the received data to the system controller 299.

The processing chamber 200 also includes a lift assembly 228 that is configured to vertically move and rotate a rotor 215 disposed in the processing volume 204. A supporting ring 216 is disposed on the rotor 215. An edge ring 218, or substrate support or substrate supporting element, is supported by the supporting ring 216. A substrate 122 is supported by the edge ring 218 during processing. The edge ring 218 and the substrate 122 are positioned above the radiant energy source 208 so that the radiant energy source 208 can heat both the substrate 122 and the edge ring 218.

The reflector plate 210 generally includes a reflecting surface 213 and typically includes cooling channels 229 formed within the body of the reflector plate 210. The cooling channels 229 are coupled to a fluid delivery device 290 that is configured to cause a cooling fluid to flow within the cooling channels 229 to maintain the reflector plate 210 and upper wall 212 at a desirable temperature. In one example, the reflector plate is maintained at a temperature between about 50 and 150° C., such as about 75° C. The reflecting surface 213 is configured to reflect/redirect the energy provided from the radiant energy source 208 back to the processing volume 204 and substrate 122.

The processing chamber 200 generally includes a cover assembly 250 that is positioned between the upper wall 212 and the substrate 122. The cover assembly 250 includes a cover 252 and a cover support 251. The cover support 251 is configured to position and retain the cover 252 in a desired position within the processing volume 204. In one configuration, the cover support 251 is positioned near the outer edge of the reflector plate 210 and is at least as large in diameter as the diameter of the substrate 122 (e.g., ≥300 mm for a 300 mm wafer). In one configuration, the cover support 251 is positioned between the outer edge of the reflector plate 210 and the inner edge of the water cooled metal plate 214. The cover support 251 may be bolted or mechanically coupled to the upper wall 212, reflector plate 210 or water cooled metal plate 214 to provide both structural and desirable thermal coupling between the components in the cover assembly 250 (e.g., cover 252) and the upper wall 212, reflector plate 210 or water cooled metal plate 214. In another embodiment, the cover support 251 may be at least partially thermally isolated from the upper wall 212, reflector plate 210 or water cooled metal plate 214 by use of a thermally insulating materials or by adjusting the thermal contact between these parts. In some configurations, it is desirable to adjust the thermal contact between the components in the cover assembly 250 (e.g., cover 252) and the upper wall 212, reflector plate 210 or water cooled metal plate 214 to allow the cover 252 to achieve a desirable temperature during processing.

The processing chamber 200 also generally includes a gas source 260 that is configured to deliver a thermal process gas to the cover volume region 255 and then to the processing volume 204 and device surface 122A of the substrate 122 by use of the ports 253 formed through the cover 252. The thermal process gas may include an inert and/or a process gas that is provided to enhance the thermal processes performed within the processing volume 204. In one example, the thermal process gas may be a gas selected from a group consisting of nitrogen, argon, hydrogen, oxygen, helium, neon, a halogen gas, and other useful gases, and/or combinations thereof. In another example, the thermal process gas may be an inert gas, such as a gas selected from a group consisting of nitrogen, helium, neon and argon.

In general, the cover 252 acts as a physical barrier to the outgassed material that flows from the substrate towards the reflector plate 210 and sensors 226 during processing (e.g., material flux "A" in FIG. 2). In one embodiment, the cover 252 is positioned a distance (e.g., gap 301 in FIG. 3) from the reflecting surface 213 of the reflector 210, so as to form a cover volume region 255 between the cover 252 and the surface 213 of the reflector plate 210. The cover volume region 255 is at least a partially enclosed region that is bounded by the cover 252, cover support 251, reflector plate 210 and upper wall 212. In some configurations, the cover volume region 255 is at least partially sealed to allow a back pressure to form therein as a flow of a thermal process gas is provided by the gas source 260 to the cover volume region 255 and out of cover volume region 255 through the ports 253 formed in the cover 252.

Also, the thermal properties of the cover 252 will allow it to act as a barrier to reduce the amount of deposition on the cover 252 (FIG. 2), versus the cooled reflector plate 210 in a conventional configuration (FIG. 1). In one example, the cover 252 is formed from an optically transparent material, such as flame fused quartz, electrically fused quartz, synthetically fused quartz, a high hydroxyl containing fused quartz (i.e., high OH quartz), sapphire, or other optically transparent material that has desirable optical properties (e.g., optical transmission coefficient and optical absorption coefficient). In one example, the cover includes a high hydroxyl containing fused quartz material that comprises a quartz material that has between about 600 and about 1,300 ppm of hydroxyl impurities. In one example, the cover includes a high hydroxyl containing fused quartz material that comprises a quartz material that has between about 1,000 ppm and about 1,300 ppm of hydroxyl impurities. The cover support 251 may be formed from a metal or a thermally insulating material, such a stainless steel, fused quartz, alumina, or other material that is able to withstand the thermal processing temperatures and has desirable mechanical properties (e.g., similar coefficient of thermal expansion (CTE) to the material from which the cover 252 is made).

During processing, the radiant energy source 208 is configured to rapidly heat the substrate 122 positioned on the edge ring 218. The process of heating the substrate 122 will cause one or more layers on or within the substrate to outgas (see arrows "A" and "B"). Typically, the amount of material that is outgassed from the device surface 122A of a substrate (see arrows A) versus the non-device surface 122B of the substrate (see arrows B) is greater.

The amount of material that will deposit on the cover 252 will depend on the temperature of the cover 252 during processing. In general, temperature of the cover 252 is selected such that it is high enough to discourage condensation of the outgassed material, but low enough to discourage a reaction between the outgassed material and the material used to form the cover 252. A reaction between the outgassed material and the material used to form the cover 252 will typically affect the optical properties of the cover 252 over time, and thus cause a drift in the thermal processes performed in the process chamber 200.

Figure 3:
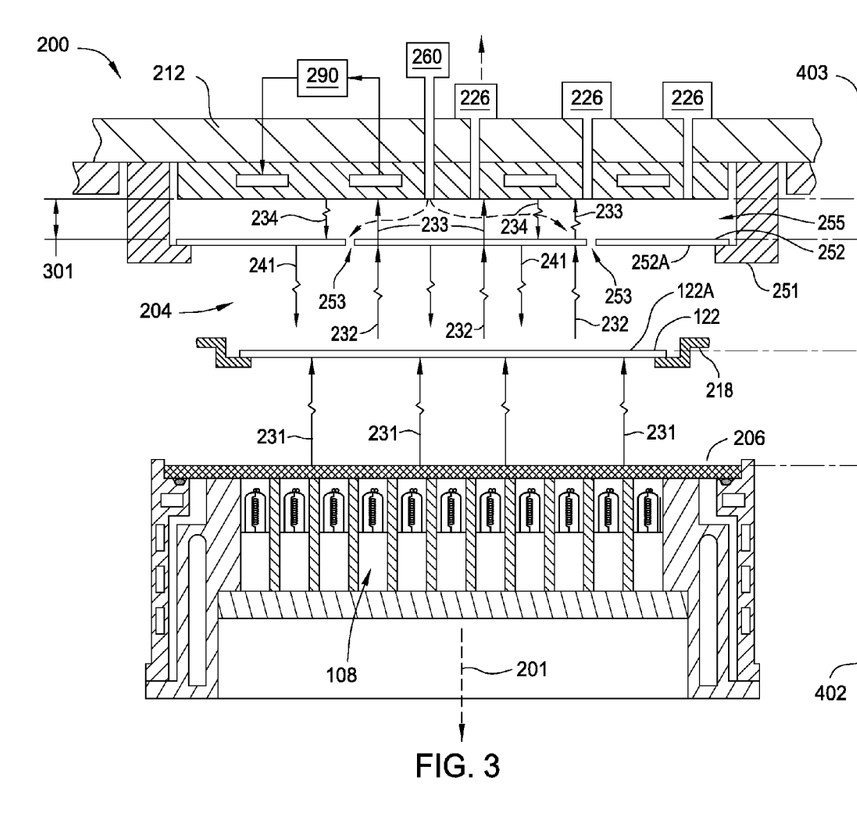
FIG. 3 illustrates a schematic partial side cross-sectional view of an thermal processing chamber according to an embodiment disclosed herein.
Figure 4:
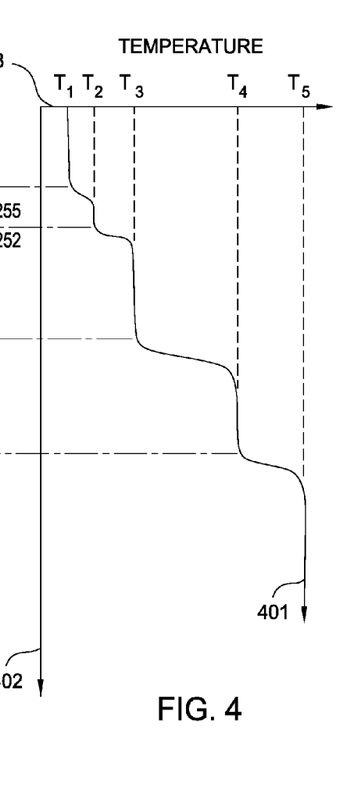
FIG. 4 illustrates a plot of temperature measured along a center line of the thermal processing chamber illustrated in FIG. 3, according to an embodiment disclosed herein.

FIG. 3 is a cross-sectional view of the processing chamber 200 illustrated in FIG. 2, schematically illustrates the thermal flux and/or energy flow within the processing chamber 200 during processing. FIG. 4 schematically illustrates a plot of temperature measured along the centerline 201 of the processing chamber 200, according to the thermal flux shown in FIG. 3. During processing, the electromagnetic energy provided from the lamps 208A is delivered to the substrate 122 and edge ring 218, to heat the substrate 122 to a desired processing temperature (e.g., temperature $T_4$ in FIG. 4), as illustrated by the thermal flux 231. The temperature $T_5$ of the window 206, which absorbs at least some of the flux 231, is less than the temperature of the lamps 218A that generate the electromagnetic energy used to heat the substrate 122. The processing temperature of the substrate 122 can be controlled using a closed loop thermal control process that uses one or more of the sensors 226, one or more of the lamps 208A and the system controller 299. At least a portion of the electromagnetic energy delivered to the substrate 122 and edge ring 218 is delivered to the cover 252 via the thermal flux 232. Based on the thermal flux 232, the cover 252 then delivers a thermal flux 233 to the reflector plate 210. In general, the thermal flux 233 includes a portion of the thermal flux 232 that is transmitted through the cover 252 and a portion of the thermal flux 232 that absorbed by the cover 252 and then re-radiated from the cover 252 to the reflector plate 210. The amount of energy that is transmitted through the cover 252 and the amount that is re-radiated by the cover 252 to the reflector plate 210 is dependent on the mechanical and optical properties of the material used to form the cover 252, such as the material's emissivity, optical absorption coefficient and optical transmission coefficient. The temperature of the cover 252 during processing will reach a temperature $T_3$. An amount of the thermal flux 233 that reaches the surface 213 of the reflector plate 210, which is maintained at a temperature $T_2$, is reflected back to the cover 252 via thermal flux 234 and then to the substrate 122 via thermal flux 241. One will note that the thermal flux 241 generally includes the energy reflected by the reflector plate 210 (i.e., thermal flux 234), the amount of energy re-radiated from the heated cover 252 (e.g., heated by absorption of thermal flux 232) and an amount of the thermal flux 232 reflected from the surface 252A of the cover 252.

It is noted that cover 252 attains a temperature $T_3$ between that of hot substrate 122 and reflector plate 210, due to the cover's location between them. If substrate 122 is at a processing temperature $T_4$ of 1100° C. and the reflector surface 213 is at a temperature $T_2$ of about 50-100° C., the temperature $T_3$ of cover 252 may range from between about 350° C. to about 700° C. depending on distances between the cover 252 and substrate 122 and the cover 252 and the reflector plate 210. The temperatures $T_2$, $T_3$ and $T_4$ may be varied by varying the temperature of substrate 122 via the amount of energy delivered from the lamps 208A. The position of the cover 252 relative to the reflector plate 210, or gap 301, is selected such that the temperature $T_3$ of cover 252 is high enough to discourage condensation of the outgassed material on the cover 252, but low enough to discourage the chemical reaction between the outgassed material and the material used to form the cover 252. One will note that the temperature $T_3$ of the cover 252 is also dependent on the thermal coupling of the cover 252 to the cooled reflector plate 210 and upper wall 212 (e.g., temperature $T_1$), which is created by the convective heat transfer created by the flow of the thermal process gas within the cover volume region 255 and the conductive heat transfer created by the amount of thermal process gas disposed in the cover volume region 255 during processing, which are all also affected by the size of the gap 301. One will note that the conductive heat transfer is dependent on the pressure of the process gas disposed in the cover volume region 255. In one example, the gap 301 is between about 0.5 mm and about 5 mm.

In one embodiment, the material from which the cover 252 is formed is selected so that it absorbs a desirable amount of the flux 232, so that it will achieve a desirable temperature $T_3$ during thermal processing. While it is common in conventional applications to select optically transparent materials that have a higher transmission coefficient and lower absorption coefficient, in some embodiments of the invention, it is desirable to select a material that has a higher absorption coefficient and lower transmission coefficient. In one example, it may be desirable to select a material used to form the window 206 that has a high transmission and low absorption coefficient, such as a fused quartz material having a low hydroxyl (OH—) concentration (e.g., 0 ppm) and select a material for the cover 252 that has a lower transmission coefficient and higher absorption coefficient, such as a fused quartz material having a high hydroxyl (OH—) concentration (e.g., >600 ppm or even >1,000 ppm). As noted above, in one example, the fused quartz material used to form the cover 252 has a high hydroxyl (OH—) concentration of between about 600 and 1,300 ppm, or a concentration of between about 1,000 and 1,300 ppm.

Figure 5:
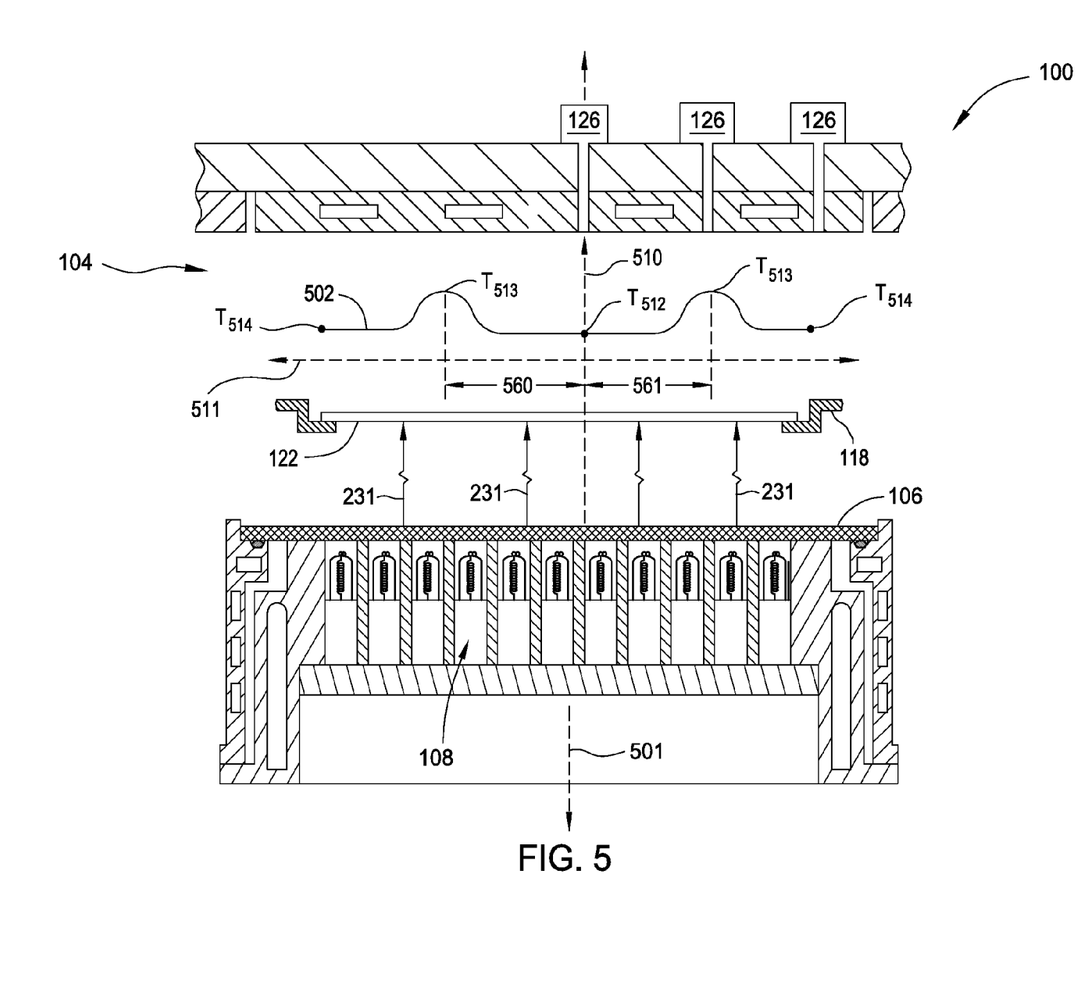
FIG. 5 is a schematic partial side cross-sectional view of the thermal processing chamber illustrated in FIG. 1.
Figure 6:
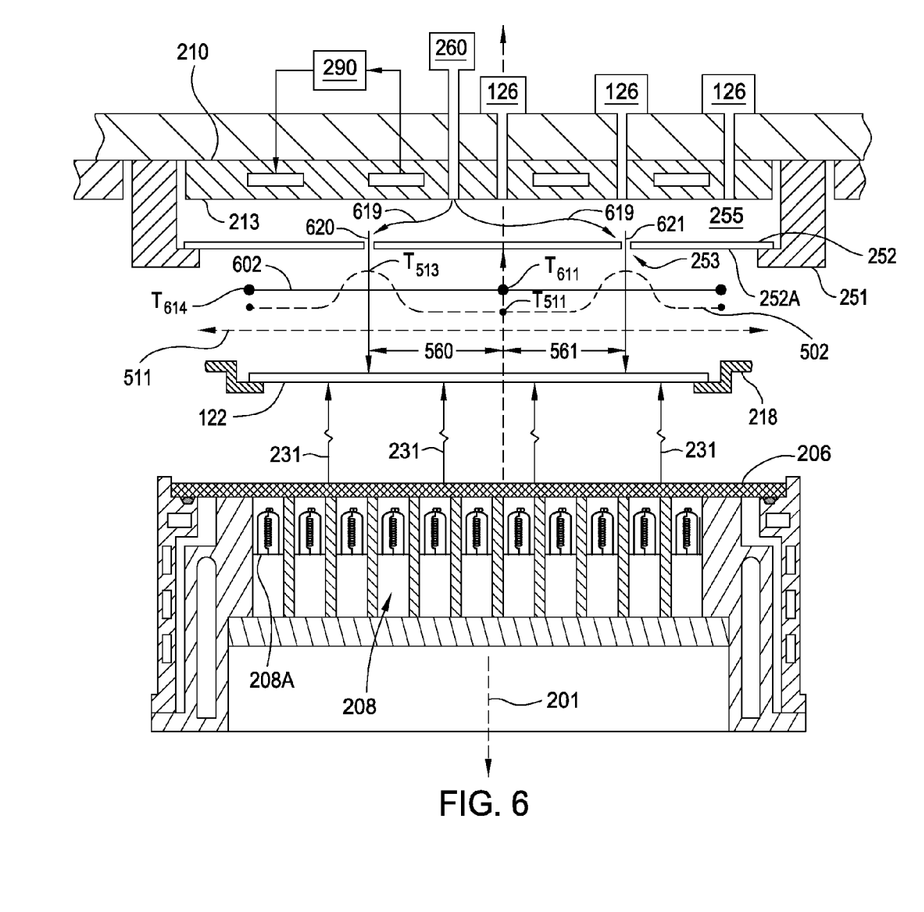
FIG. 6 illustrates a schematic partial side cross-sectional view of the thermal processing chamber shown in FIGS. 2-3, according to an embodiment disclosed herein.

In some embodiments, as illustrated in FIG. 6, the cover assembly 250 is configured to help adjust for temperature non-uniformities found on the substrate 122 during processing, due to non-uniformity of the thermal flux 231 and/or variations in the thermal environment in the thermal processing chamber 200. FIG. 5 is a schematic side cross-sectional view of a conventional processing chamber 100 (FIG. 1) that has a non-uniform thermal profile 502 created on a substrate 122 in the processing volume 104. The thermal profile 502, which relates to the temperature of the substrate 122 measured radially across the substrate 122 in a direction 511 and having a relative temperature variation illustrated in the direction 510. Therefore, in the example illustrated in FIG. 5, the substrate 122 has a large variation in temperature at about half the radius of the substrate 122, as measured from the center line 201. The higher temperature variation is illustrated in FIG. 5 by the elevated temperature region that has a peak temperature $T_{513}$, which is greater than the substrate's center temperature $T_{512}$ and the edge temperatures $T_{514}$. In one example, the peak temperatures $T_{513}$ are positioned at a distance 560, 561 from the center line 501.

FIG. 6 is a schematic side cross-sectional view of the processing chamber 200 that illustrates an improved thermal profile 602 found on a substrate 122 disposed within the processing volume 204 during processing, due to the use of features formed within the cover assembly 250. In some embodiments, the features may include a plurality of ports 253 that are formed within the cover 252 and positioned to deliver a gas flow to desired regions of the surface 122A of the substrate 122. The gas flow is generally created by the delivery of the thermal processing gas from the gas source 260 into the cover volume region 255 via gas flow 619 and then through the ports 253 formed in the cover 252. In this configuration, the flow of the thermal processing gas into the cover volume region 255 is high enough to create a higher pressure in the cover volume region 255 versus the processing volume 204 to create gas flows 620, 621 through the ports 253. The higher pressure generated in the cover volume region 255 versus the processing volume 204 will also tend prevent the material outgassed from the substrate 122 from making its way to the surface 213 of the reflector plate 210. One will also note that the flow rate and pressure in the cover volume region 255 will affect the thermal coupling of the cover 252 and the reflector plate 210, and thus affect the temperature ($T_3$) of the cover 252.

FIG. 6 also includes an illustration of the thermal profile 502 of a substrate 122, which would typically be created if the cover assembly 250 was not installed, or if the gas flow was not delivered to the surface of substrate 122 through the ports 253, due to inherent non-uniformity in the thermal processing environment. Therefore, to adjust for these inherent non-uniformities, the ports 253 formed in the cover 252 are positioned to direct the gas flows 620, 621 to regions of the substrate 122 that have a higher temperature in an effort to cool the substrate in these regions. In one example, at least a portion of the thermal processing gas delivered to the cover volume region 255 flows from the cover volume region 255 through one or more of the ports 253 formed in the cover 252 to a portion of the device side surface 122A of the substrate 122 that has a higher temperature than the average temperature of the substrate 122 during processing. The addition of the ports 253, and gas flow that is generated through them, can thus be used to provide a more uniform thermal profile, as shown by the thermal profile 602. In one embodiment, the ports 253 are positioned in a symmetric pattern about the center line 201 of the cover 252 (e.g., equal radial distances 560, 561) to compensate for radial non-uniformity within the processing chamber 200. While it is common to rotate the lift assembly 228 and substrate 122 during thermal processing to compensate for non-radial thermal environment variations, a non-symmetric pattern of ports 253 may also be used to compensate for non-radial temperature variations (i.e., radial distances 560 and 561 are not equal). In some embodiments, the gap formed between the substrate 122 and the cover 252 and flow rate of the flow of gas 620, 621 is maintained to further minimize the deposition of the outgassed material on the cover due to a relative fluid motion created between the cover 252 and the substrate 122, which may or may not be rotating during processing. One skilled in the art will appreciate that the ports 253 are positioned to direct a gas flow to specific regions of the substrate to compensate for thermal variations seen in the thermal profile on the substrate, and that delivering a gas to the surface of the substrate 122 will tend to reduce the substrate's process temperature during processing, due to the heat capacity of the thermal processing gas and convective heat transfer of the flowing thermal processing gas. In configurations that by deliver a non-specific, non-targeted or broad flow of thermal processing gas across the whole surface of the substrate during processing (e.g., showerhead configurations) will typically include some undesirable thermal processing characteristics. These undesirable thermal processing characteristics will include an undesirable drop the average processing temperature of the substrate, use a large amount of the thermal process gas during processing and reduce the effectiveness/efficiency of the process of removing specific temperature non-uniformities. Therefore, in some embodiments, it is desirable to provide only a small number, or density, of ports 253 to specific regions of the cover 252 to specifically compensate for the thermal variations seen on the substrate 122. In one example, the cover 252 includes less than 52 ports 253 that have a 1-2 mm diameter that are distributed across a 360 mm diameter cover 252. In another example, the cover 252 includes 12 ports that have a 1 mm diameter that are disposed on a 190 mm diameter circle and 8 ports that have a 1 mm diameter that are disposed on a 140 mm diameter circle within a 360 mm diameter cover 252.

One will note that the thermal profile 602 generally has a higher center temperature $T_{612}$ and edge temperatures $T_{614}$ than the center temperature $T_{512}$ and edge temperatures $T_{514}$ of the thermal profile 502 formed in the processing chamber 100 illustrated in FIG. 5. The difference in the these temperatures is generally due to the positioning of the cover 252 between the cooler reflector plate 210 and the substrate 122, as discussed above in conjunction with FIGS. 3-4. The improved thermal profile 602 and average substrate processing temperatures will improve the temperature uniformity of the substrate 122 during thermal processing and improve the overall efficiency of the thermal processes performed in the processing chamber 200.

The cover assembly 250 also provides a number of cost-of-ownership advantages over the conventional thermal processing chamber 100 (FIG. 1) designs. The cost-of-ownership advantages, for example, are created by the ease in which the cover 252 can be removed from the processing chamber 200 and the low relative cost to form and replace the cover 252 versus the other chamber components, such as the reflector plate 210. As noted above, due to the deposition of the outgassed material on the cooler thermal processing chamber parts, these coated parts will need to be replaced and/or cleaned periodically to reduce the effect that the outgassed material has on the thermal processing environment. In a conventional design, due to the need to protect the optically sensitive surface of the reflector plate 110 and the need cool the reflector plate 110 during processing, its manufacturing cost and the normal handling requirements make the replacement of the reflector plate 110 undesirable. Therefore, in some embodiments of the invention, due to the cover's relatively simple shape, low material cost and very simple handling requirements (e.g., cover may be fragile) it is generally easier to replace the cover 252 than replace a reflector plate found in a conventional chamber design. Moreover, due to the cover's relatively simple shape and low material cost, it may be more cost effective to discard a used cover 252 rather than being refurbished/cleaned before re-installation back into the processing chamber 200.

Even though a thermal process and thermal processing chamber are described above, embodiments of the present invention may be used to any process and in any process chamber where a supporting structure or a substrate is exposed to a radiant energy.

While the foregoing is directed to embodiments of the present invention, other and further embodiments of the invention may be devised without departing from the basic scope thereof, and the scope thereof is determined by the claims that follow.

What is claimed is:

1. A thermal processing chamber, comprising:
an energy source positioned to deliver energy towards a substrate support during processing;
a reflector having a reflective surface, wherein the substrate support is disposed between the energy source and the reflector;
a cover disposed between the reflector and the substrate support, wherein a cover volume region is formed between the cover and the reflective surface and the cover is at least partially optically transparent; and
a gas source that is configured to provide a gas to the cover volume region,
wherein the cover comprises a plurality of ports, wherein each of the ports are configured to deliver the gas provided by the gas source to a surface of a substrate positioned on the substrate support during processing.

2. The thermal processing chamber of claim 1, further comprising a fluid delivery device that is configured to cause a cooling fluid to flow within cooling channels formed within the reflector.

3. The thermal processing chamber of claim 1, further comprising a plurality of temperature sensors that are configured to measure a temperature of the substrate positioned on the substrate support during processing, wherein the cover and cover volume region are disposed between the sensors and the substrate during processing.

4. The thermal processing chamber of claim 1, further comprising a window disposed between the energy source and the substrate support, wherein an optical transmission coefficient of a material used to form the window is greater than an optical transmission coefficient of a material used to form the cover.

5. The thermal processing chamber of claim 1, wherein the cover comprises a high hydroxyl impurity containing fused quartz.

6. A thermal processing chamber, comprising:
an energy source positioned to deliver energy towards a substrate support during processing;
a reflector having a reflective surface, wherein the substrate support is disposed between the energy source and the reflector;
a cover disposed between the reflector and the substrate support, wherein a cover volume region is formed between the cover and the reflective surface and the cover is at least partially optically transparent; and
a gas source that is configured to provide a gas to the cover volume region,
wherein the cover is disposed over a device side of a substrate that is positioned on the substrate support.

7. A method for processing a substrate, comprising:
delivering electromagnetic energy from an energy source towards a substrate support during processing, wherein the substrate support is configured to support a non-device side surface of a substrate; and
delivering a thermal processing gas to a cover volume region formed between a reflector plate and a cover, wherein the cover is disposed between the reflector plate and the energy source,
wherein at least a portion of the thermal processing gas delivered to the cover volume region flows from the cover volume region through one or more ports formed in the cover to a portion of the device side surface of the substrate that has a higher temperature than the average temperature of the substrate during processing.

8. The method of claim 7, wherein the thermal processing gas comprises an inert gas.

9. The method of claim 7, wherein delivering electromagnetic energy from the energy source further comprises:
delivering the electromagnetic energy through a window disposed between the energy source and the substrate support, wherein an optical transmission coefficient of a material used to form the window is greater than an optical transmission coefficient of a material used to form the cover.

10. The method of claim 7, further comprising flowing a cooling fluid within cooling channels formed within the reflector plate.

11. The method of claim 7, further comprising measuring a temperature of the substrate during processing using one or more sensors, wherein the cover and cover volume region are disposed between the sensors and the substrate during processing.

* * * * *

UNITED STATES PATENT AND TRADEMARK OFFICE
CERTIFICATE OF CORRECTION

PATENT NO. : 9,514,969 B2  Page 1 of 1
APPLICATION NO. : 14/550781
DATED : December 6, 2016
INVENTOR(S) : Aaron Miller et al.

It is certified that error appears in the above-identified patent and that said Letters Patent is hereby corrected as shown below:

In the Specification

In Column 8, Line 44, delete "(e.g., 0 ppm)" and insert -- (e.g., $\leq 10$ ppm) --, therefor.

Signed and Sealed this
Fourth Day of April, 2017

Michelle K. Lee
*Director of the United States Patent and Trademark Office*